United States Patent [19]

West et al.

[11] Patent Number: 5,403,466
[45] Date of Patent: Apr. 4, 1995

[54] SILVER PLATING PROCESS FOR LEAD FRAMES

[75] Inventors: David W. West, Pembroke; Harold T. Kelleher, Attleboro, both of Mass.

[73] Assignee: Texas Instruments Incorporated, Dallas, Tex.

[21] Appl. No.: 140,642

[22] Filed: Oct. 22, 1993

[51] Int. Cl.⁶ ............................................... C25D 5/02
[52] U.S. Cl. .................... 205/122; 205/128; 205/223; 156/656; 156/659.1; 430/313; 430/318
[58] Field of Search ............. 205/118, 122, 128, 223; 156/656, 659.1; 430/311, 313, 318

[56] References Cited

U.S. PATENT DOCUMENTS 5,183,724 2/1993 Johnson .............................. 205/128

FOREIGN PATENT DOCUMENTS 62-2643 1/1987 Japan .

Primary Examiner—John Niebling
Assistant Examiner—Edna Wong

[57] ABSTRACT

A method of providing selective silver plating to a lead frame structure 10 performs the silver plating operation prior to etching the lead frame, thereby avoiding mechanical damage to the lead frame during plating, and producing finished silver spots 24 on the top surface of the lead frame only, with no plating on the gauge. The disclosed method includes the steps of applying a layer of photoresist 42 to a surface of a sheet of lead frame material 40, exposing areas of the photoresist such as to define selected regions 44, developing the photoresist 42 to uncover the lead frame material 40 at the selected regions 44, and plating the surface of the sheet defined by the layer of photoresist 42 with an electrically conductive material 46. The method further includes subsequent steps of stripping the layer of photoresist 42 from the surface, applying a layer of a second photoresist 50 to the plated surface, exposing areas of the second layer of photoresist 50 such as to define an unexposed lead frame pattern, the selected regions 44 corresponding to electrical contact locations on the lead frame pattern, and developing the photoresist 50 to uncover exposed regions 52 of the sheet of lead frame material 40. The method includes a final step of etching the sheet 40 to remove material from regions 52 uncovered by the second photoresist layer 50.

16 Claims, 2 Drawing Sheets

SILVER PLATING PROCESS FOR LEAD FRAMES

BACKGROUND OF THE INVENTION

The present invention relates generally to packaging for semiconductor integrated circuits and, more particularly, to a process for manufacturing an integrated circuit lead frame structure having selective silver plating thereon.

In the manufacture of integrated circuit devices, lead frames are used to provide electrical interconnection to a semiconductor circuit. Typically, the base metal of the lead frame is copper because of its high thermal conductivity. Other base metals include stainless steel and Alloy 42, which is an alloy of 42% nickel and 58% iron. Heat transfer, rather than electrical conductivity, is of paramount importance in the selection of the lead frame base metal.

It is known to plate the entire surface of a lead frame with a highly-conductive coating in order to improve its electrical conductivity. One such conductive coating is silver, which displays excellent electro-conductivity and corrosion resistance, but is costly because it is a precious metal. There/ore, it is desired that a silver plating should be applied only where its electrical characteristics are particularly needed. In addition, from an economic standpoint, it is desired that the plating should be as thin as possible. In the case of a lead frame, it is desired to limit the area coated with silver to the mounting site where the silicon device is attached, and to the regions where gold wires are attached using, e.g., wire-bonding techniques.

However, using the selective silver plating processes for lead frames which are currently known, yield losses due to mechanical damage to the lead tips are excessive. This is a result of the additional handing of the delicate structure during the plating process. Furthermore, the yield loss is aggravated as the pin count of the lead frame increases and the thickness of the lead frame material decreases.

In view of the above, it is clear that there exists a need to develop a method for providing selective silver plating of a lead frame device which reduces the possibility of mechanical damage and the resultant yield loss which is an improvement over what is currently known in the art.

SUMMARY OF THE INVENTION

In accordance with the principles of the present invention, there is disclosed herein a method for manufacturing a lead frame having a plating of an electrically conductive material at selected locations thereon. The method comprises an initial step of plating selected portions of a sheet of lead frame material with an electrically conductive material, and a subsequent step of etching the sheet to produce the lead frame having the plating of the electrically conductive material at the selected locations.

Further in accordance with the present invention there is disclosed a method of manufacturing a lead frame having a plating of an electrically conductive material at selected contact locations thereon. The method comprises a first step of providing a sheet of lead frame material, a second step of applying a layer of photoresist to a surface of the sheet, a third step of exposing areas of the photoresist such as to define the selected regions, a fourth step of developing the photoresist to uncover the lead frame material at the selected regions, and a fifth step of plating the surface of the sheet defined by the layer of photoresist with an electrically conductive material. The method further includes a sixth step of stripping the layer of photoresist from the surface, a seventh step of applying a second layer of photoresist to the plated surface, an eighth step of exposing areas of the second layer of photoresist such as to define an unexposed lead frame pattern, the selected regions corresponding to electrical contact locations on the lead frame pattern, and a ninth step of developing the photoresist to uncover exposed regions of the sheet of lead frame material. The method includes a final step of etching the sheet to remove material from regions uncovered by the second photoresist layer.

BRIEF DESCRIPTION OF THE DRAWING

The foregoing features of the present invention may be more fully understood from the following detailed description, read in conjunction with the accompanying drawings, wherein.

DESCRIPTION OF THE PREFERRED EMBODIMENT

As suggested above in relation to prior art methods for selectively applying a silver plating to a lead frame device, the standard process flow is to etch the lead frame first, then apply selective silver spot. However, after etching, the lead frame is very susceptible to mechanical damage which may result from its handling while the plating process is being performed. The plating process must make use of index holes which are etched in the lead frame in order to position the silver spot. Pins must be placed in these holes to properly align the lead frame during plating, and this process, in itself, is a potential source of mechanical damage.

The method of providing selective silver plating to a lead frame structure in accordance with the principles of the present invention, avoids mechanical damage to the lead frame by performing the silver plating operation prior to etching the lead frame.

The preferred embodiment of the present invention is best understood by referring to FIGS. 1 and 2a through 2g of the drawings, like numeric designators being used for the same or substantially identical parts of the various drawings.

Figure 1:
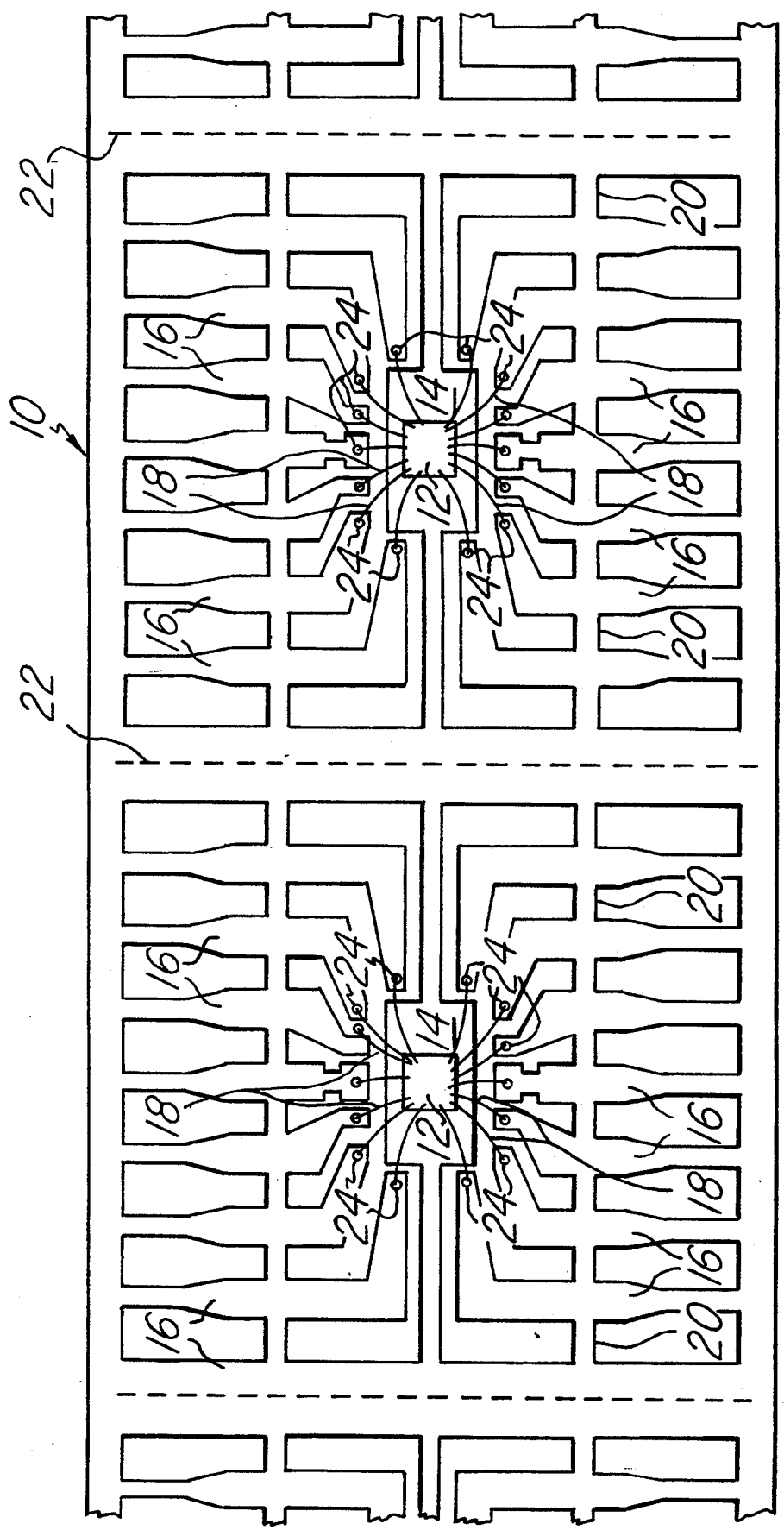
FIG. 1 is a top view of a lead frame device having selectively plated silver spots.

Referring first to FIG. 1, there is shown a top view of a typical lead frame 10 used to support a semiconductor circuit 12. The lead frame 10 comprises a platform 14 on which the semiconductor 12 is bonded. The semiconductor circuit 12 is connected to the external leads 16 using fine wire 18, typically made from gold. Dam bars 20 connect the external leads 16, but are subsequently trimmed away after a packaging medium has been applied. As shown in FIG. 1, lead frames 10 are typically connected to each other by connecting strips 22 for mass production. Lead frame 10 includes spots 24 covered by a silver plating to enhance connectivity between the individual leads of lead frame 10 and gold wires 18, and between the individual leads of lead frame 10 and contacts on a printed wiring board (not shown).

Figure 2A:
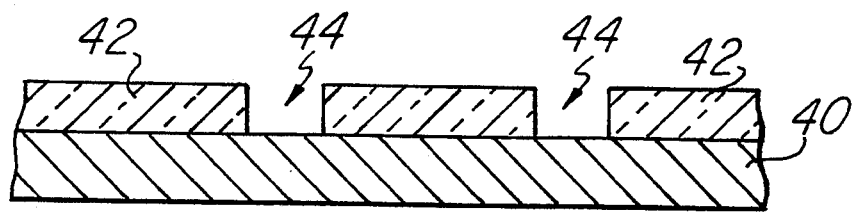
FIGS. 2a through 2g illustrate the lead frame device of FIG. 1 in cross-sectional view at various stages in a process for selectively applying silver plating spots in accordance with the present invention.

Referring now to FIGS. 2a through 2g, there is illustrated the lead frame device of FIG. 1 in cross-sectional view at various stages in a process for selectively applying silver plating spots 24 in accordance with the present invention. FIG. 2a illustrates a metallic base material 40 from which lead frame 10 is to be formed. Base material 40 may illustratively comprise a thin sheet of copper, stainless steel or Alloy 42, illustratively 0.005 inch (0.13 mm) in thickness, and typically having a thickness between 0.003 and 0.012 inch (0.08 and 0.30 mm). A layer of photoresist 42 is applied to a surface of base material 44). Photoresist 42 may illustratively comprise a light-sensitive acrylic polymer system, and is applied in a sheet or as a liquid, illustratively to a thickness of 0.0006 inch (0.015 mm), and typically within a range of thicknesses between 0.0002 and 0.003 inch (0.005 and 0.08 mm).

Photoresist 42 is then masked, and the uncovered portions of the coated surface of base material 40 are exposed to ultraviolet (UV) light, resulting in a pattern which defines the locations 44 which are to be selectively plated with an electrically conductive material. Photoresist 42 is developed to remove the unmasked areas of photoresist 42, exposing the regions 44 of the base metal 40 which are to be plated.

Figure 2B:
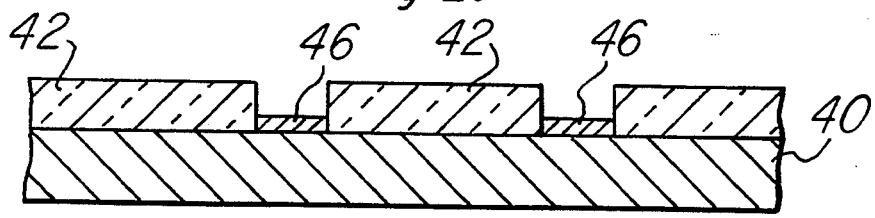

In FIG. 2b, a layer 46 of silver has been deposited on the structure of FIG. 2a within the region defined by photoresist 42. This layer 46 is preferably applied by electrodeposit, but it may also be applied by other plating processes well known in the art, such as electroless. The thickness of the silver layer 46 may typically be from $50 \times 10^{-6}$ to $500 \times 10^{-6}$ inch (1.3 to 12.7 microns), and is preferably in the range of $100 \times 10^{-6}$ to $150 \times 10^{-6}$ inch (2.5 to 3.8 microns). Since photoresist 42 is not a conductor, silver layer 46 does not adhere to it.

Figure 2C:
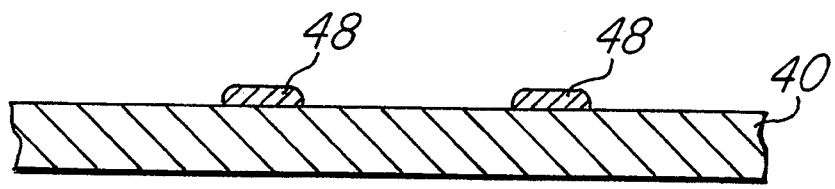

As shown in FIG. 2c, the photoresist 42, which is present everywhere except where the base material 40 has been plated, is stripped, leaving only the selective silver spots 48 on base material 40. The stripping process is preferably accomplished by an aqueous dissolution with an alkaline solution.

Figure 2D:
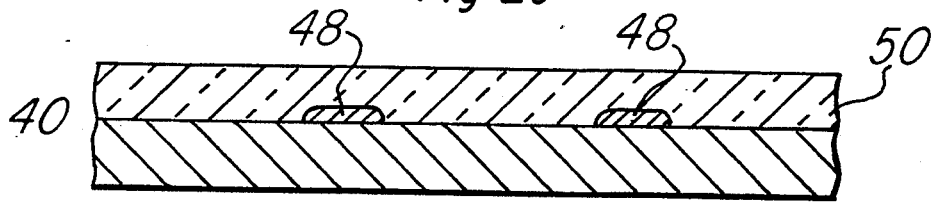

In FIG. 2d, a second photoresist layer 50 is applied to a surface of base material 40 from which lead frame 10 is to be formed. The photoresist of layer 50 illustratively comprises a light-sensitive acrylic polymer system, and may be applied in a sheet or as a liquid, illustratively to a thickness of 0.0006 inch (0.015 mm), and typically within a range of thicknesses between 0.0002 and 0.003 inch (0.005 and 0.08 mm).

Figure 2E:
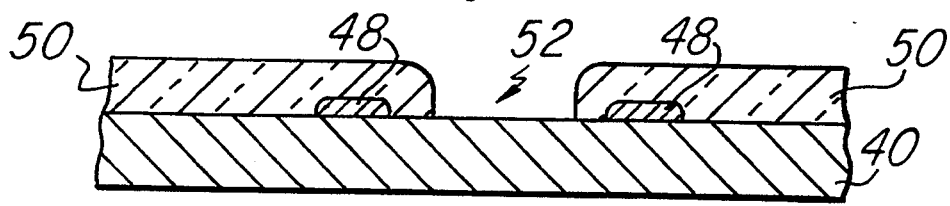

Photoresist layer 50 is then masked, and the uncovered portions of the coated surface of base material 40 are exposed to light, resulting in a pattern which defines a lead frame device, and further wherein selective silver spots 48 correspond to electrical contact locations on the lead frame pattern. FIG. 2e illustrates the structure of FIG. 2d which remains when photoresist 50 is developed to remove the unmasked areas of layer 40, exposing the region 52 of the base metal 40 which is to be etched away to form lead frame 10.

Figure 2F:
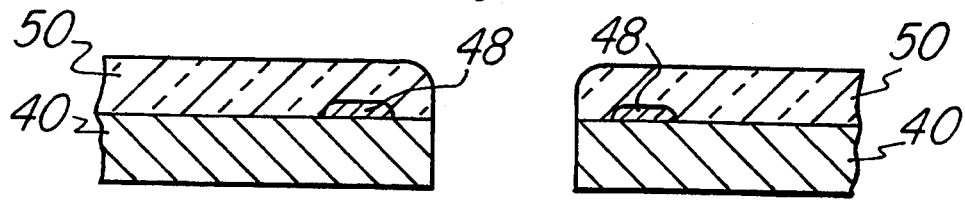

FIG. 2f illustrates the structure of FIG. 2e after an etching process, during which the exposed portion 52 of base material 40 has been removed. This etching process is typically a wet etch process, preferably using ferric chloride as the etchant. Alternatively, the etchant may comprise cupric chloride. In another embodiment, the process may comprise electrochemical etching, using either of these etchants. There are, in addition, many other well-known etch processes and etchants, and it is not intended that the present invention be limited to any particular ones.

Figure 2G:
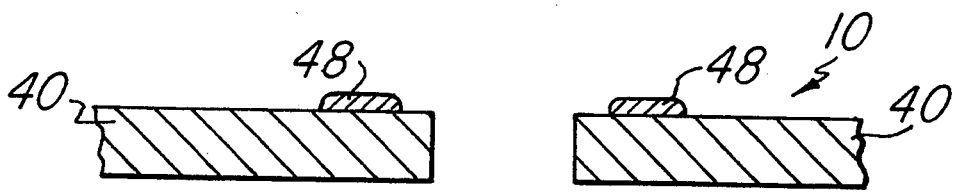

The remaining photoresist 50 of the device shown in FIG. 2f is stripped from the etched base material 40 leaving only a finished lead frame device having the selective silver spots 48 as shown in FIG. 2g. The stripping process is preferably accomplished by an aqueous dissolution with an alkaline solution.

In subsequent processes, finishing operations, which are well known in the art, may be performed on the etched device, such as tape, offset and cut operations. These operations prepare the lead frame for use in the machines that perform the die attachment and encapsulation procedures. Referring once again to FIG. 1, it is seen that the finished lead frame structure 10 is cut along connecting strips 22 to mass produce a plurality of lead frame devices.

While the foregoing illustrative embodiment of the present invention describes the electrically conductive material which is selectively plated on the lead frame as silver, it will be recognized by those skilled in the art to which it pertains that gold, platinum or any other material of high electrical conductivity and which lends itself to plating processes may be substituted for the silver material which was cited merely by way of example. It will also be recognized that the specifics of the various processes recited above, i.e., the applying, masking, exposing, developing and stripping of the photoresists, the types of resists used, the process of depositing the plating layer, and the process of etching the base material to form the lead frame, are given as illustrative, and that other processes and materials which provide equivalent results may be substituted therefor.

The selective plating process as illustrated in FIGS. 2a through 2g and as described above, overcomes certain limitations of prior art approaches. Since the plating process occurs prior to the lead frame being etched from the blank base material, no damage is caused to the lead tips by the plating operation. No silver is plated onto the gauge, i.e., the thickness dimension of the base material, as occurs in all current lead frame plating processes, since the plating process precedes the etch process. Silver on the gauge is undesirable as it can lead to device failures by allowing two adjacent leads to make electrical contact through the silver itself or by dendritic growth of the silver on the gauge.

It has been determined that the process of the present invention improves the silver spot location capability from ±0.010 inch (0.25 mm) to ±0.002 inch (0.05 mm). The process of the present invention enables production of lead frames having very high pin counts, and it allows use of lead frame materials of thinner gauges. The process allows much improved uniformity of the silver deposit over a wider range of electrical conditions, e.g., current densities, by eliminating lead frame geometry considerations during the plating operation. Finally, the process of the present invention allows for very high levels of complexity in the patterning of the silver spots, e.g., applying silver only on the lead tips, and it offers the opportunity to provide multiple layers of silver without introducing any additional likelihood of damage to the lead flame device. Hence, for the manufacture of lead flames having selective silver plating as envisioned here, the approach in accordance with the present invention provides a significant advantage.

While the principles of the present invention have been demonstrated with particular regard to the method disclosed herein, it will be recognized that various departures may be undertaken in the practice of the invention. The scope of the invention is not intended to be limited to the particular method disclosed herein, but should instead be gauged by the breadth of the claims which follow.

What is claimed is:

1. A method of manufacturing a lead frame having a plating of an electrically conductive material at selected locations thereon, said method comprising the steps of:

providing a sheet of lead frame material;

patterning a layer of resist on a surface of said sheet to expose said lead frame material at said selected regions;

plating the surface of said sheet defined by said layer of resist with an electrically conductive material;

patterning a layer of a second resist on said plated surface which defines an unexposed lead frame pattern, said selected regions corresponding to electrical contact locations on said lead frame pattern; and etching said sheet to remove material from regions uncovered by said second resist layer.

2. The method in accordance with claim 1 wherein said electrically conductive material is selected from among the group comprising silver, gold and platinum.

3. The method in accordance with claim 1 wherein said electrically conductive material comprises silver.

4. The method in accordance with claim 1 wherein said plating step comprises an electrodepositing process.

5. The method in accordance with claim 1 wherein said etched sheet is cut to produce a plurality of lead frames.

6. The method in accordance with claim 1 wherein said lead frame material is selected from among copper, stainless steel and Alloy 42, and wherein the etchant used in said etching step is selected from among ferric chloride and cupric chloride.

7. The method in accordance with claim 1 wherein said first-mentioned resist comprises an acrylic polymer system and said first-mentioned patterning step comprises exposing said resist to ultraviolet (UV) light.

8. The method in accordance with claim 1 wherein said second resist comprises an acrylic polymer system and said second-mentioned patterning step comprises exposing said resist to UV light.

9. A method of manufacturing a lead frame having a plating of an electrically conductive material at selected contact locations thereon, said method comprising the steps of:

providing a sheet of lead frame material;

applying a layer of photoresist to a surface of said sheet;

exposing areas of said photoresist such as to define said selected regions;

developing said photoresist to uncover said lead frame material at said selected regions;

plating the surface of said sheet defined by said layer of photoresist with an electrically conductive material;

stripping said layer of photoresist from said surface;

applying a layer of a second photoresist to said plated surface;

exposing areas of said second layer of photoresist such as to define an unexposed lead frame pattern, said selected regions corresponding to electrical contact locations on said lead frame pattern;

developing said photoresist to uncover exposed regions of said sheet of lead frame material; and etching said sheet to remove material from regions uncovered by said second photoresist layer.

10. The method in accordance with claim 9 wherein said electrically conductive material is selected from among the group comprising silver, gold and platinum.

11. The method in accordance with claim 9 wherein said electrically conductive material comprises silver.

12. The method in accordance with claim 9 wherein said plating step comprises an electrodepositing process.

13. The method in accordance with claim 9 wherein said etched sheet is cut to produce a plurality of lead frames.

14. The method in accordance with claim 9 wherein said lead frame material is selected from among copper, stainless steel and Alloy 42, and wherein the etchant used in said etching step is selected from among ferric chloride and cupric chloride.

15. The method in accordance with claim 9 wherein said first-mentioned photoresist comprises an acrylic polymer system and said first-mentioned developing step comprises selective aqueous dissolution in an alkaline solution.

16. The method in accordance with claim 9 wherein said second photoresist comprises an acrylic polymer system and said second-mentioned developing step comprises selective aqueous dissolution in an alkaline solution.

* * * * *